United States Patent
Cheng et al.

(10) Patent No.: US 8,749,990 B2
(45) Date of Patent: Jun. 10, 2014

(54) MULTIPLE-BOARD POWER CONVERTER

(75) Inventors: Sun-Wen Cyrus Cheng, Plano, TX (US); Carl Milton Wildrick, Parker, TX (US); Jeffrey John Boylan, Richardson, TX (US)

(73) Assignee: TDK-Lambda Corporation

( * ) Notice: Subject to any disclaimer, the term of this patent is extended or adjusted under 35 U.S.C. 154(b) by 0 days.

(21) Appl. No.: 11/564,675

(22) Filed: Nov. 29, 2006

(65) Prior Publication Data

US 2008/0123312 A1 May 29, 2008

(51) Int. Cl.
*H05K 1/11* (2006.01)
*H02B 1/00* (2006.01)

(52) U.S. Cl.
USPC ........... 361/790; 361/791; 361/784; 361/785; 361/601; 361/735

(58) Field of Classification Search
CPC ......... H05K 1/14; H05K 1/141; H05K 1/142; H05K 1/144; H05K 1/145; H05K 2201/10189; H05K 2201/1059; H05K 3/368; H05K 3/308; H05K 3/361; H01R 9/096
USPC ......... 361/790–795, 700, 688, 690, 694, 696, 361/697, 701, 702, 709, 711, 785, 735, 601, 361/762, 679.01, 704, 695, 689, 784, 770, 361/804; 174/250
See application file for complete search history.

(56) References Cited

U.S. PATENT DOCUMENTS

| | | | | |
|---|---|---|---|---|
| 5,880,930 | A * | 3/1999 | Wheaton | 361/690 |
| 5,910,885 | A * | 6/1999 | Gulachenski et al. | 361/774 |
| 5,933,343 | A * | 8/1999 | Lu et al. | 363/144 |
| 6,731,514 | B2 * | 5/2004 | Evans | 361/790 |
| 7,345,891 | B2 * | 3/2008 | Barsun et al. | 361/803 |
| 7,417,861 | B2 * | 8/2008 | Kikuchi et al. | 361/718 |
| 2002/0131258 | A1 * | 9/2002 | Inoue et al. | 361/803 |
| 2003/0057548 | A1 * | 3/2003 | Hartke et al. | 257/718 |
| 2005/0094356 | A1 * | 5/2005 | Onizuka et al. | 361/611 |
| 2005/0189566 | A1 * | 9/2005 | Matsumoto et al. | 257/200 |
| 2006/0044762 | A1 * | 3/2006 | Kikuchi et al. | 361/704 |
| 2006/0164811 | A1 * | 7/2006 | Maxwell et al. | 361/709 |
| 2006/0284308 | A1 * | 12/2006 | Harada et al. | 257/729 |

* cited by examiner

*Primary Examiner* — Hoa C Nguyen
(74) *Attorney, Agent, or Firm* — David W. Carstens; Kevin M. Klughart; Carstens & Cahoon, LLP

(57) ABSTRACT

The present invention provides a DC-DC power converter that comprises two or more Printed Wiring Boards (PWB) mounted parallel to one another and without encapsulation. Electronic components can be mounted on both sides of each board. The open design and parallel orientation of the PWBs allow airflow over components mounted on the PWBs. The PWBs are preferable made of FR-4 with copper foils, with one thicker board being comprised of more copper layers and the other boards comprised of less copper layers. In the preferred embodiment, the power processing elements are housed in the thicker PWB, while the thinner boards house the control circuitry.

7 Claims, 6 Drawing Sheets

MULTIPLE-BOARD POWER CONVERTER

TECHNICAL FIELD

The present invention relates generally to power converters, and more specifically to a power converter comprises two or more printed wiring boards in parallel.

BACKGROUND OF THE INVENTION

DC-to-DC converters are common components that take a first input voltage and convert it into one or more output voltages. This allows a user to take a higher battery voltage, such as 48 volts, and convert it down to a first and second output voltage, such as 12 volts and 5 volts, enabling the higher voltage DC source to be used to power various circuits that require lower voltage. Such a converter can provide either a single output voltage or multiple voltage outputs. DC-DC power converters typically comprise one of three configurations.

The first configuration is a single FR-4 Printed Wiring Board (PWB) with parts on both sides, with or without encapsulation. Flame Resistant 4 (FR-4) is a form of epoxy resin bonded glass fabric (ERBGF). The main limitation of this configuration is the limited available board areas for mounting components. Furthermore, it does not provide thermal isolation of sensitive components and is subject to noise from the power elements. Furthermore, components often have to be shrunk to fit the available footprint, which reduces the upper power range, e.g., ~50 W for a 1"×1" footprint.

The second configuration comprises one Insulated Metal Substrate (IMS) board with parts on one side and optional heat sink on the other flat side, plus one FR-4 PWB with parts on both sides and interconnects to the IMS board. While this configuration offers more areas for mounting components, the outward facing surface of the IMS is not populated with components.

The third configuration typically seen with DC-DC power converters comprises multiple FR-4 PWBs with parts on each PWB. However, the "daughter" boards are not parallel to the main board, which can interfere with airflow over the components depending on the orientation of the power converter.

Many current designs also have many interconnects between the boards, which reduces the board area available for mounting components.

SUMMARY OF THE INVENTION

The present invention provides a DC-DC power converter that comprises two or more Printed Wiring Boards (PWB) mounted parallel to one another and without encapsulation. Electronic components can be mounted on both sides of each board. The open design and parallel orientation of the PWBs allow airflow over components mounted on the PWBs. The PWBs are preferable made of FR-4 with copper foils, with one thicker board being comprised of more copper layers and the other boards comprised of less copper layers. In the preferred embodiment, the power processing elements are housed in the thicker PWB, while the thinner boards house the control circuitry.

BRIEF DESCRIPTION OF THE DRAWINGS

The novel features believed characteristic of the invention are set forth in the appended claims. The invention itself, however, as well as a preferred mode of use, further objects and advantages thereof, will best be understood by reference to the following detailed description of an illustrative embodiment when read in conjunction with the accompanying drawings, wherein:

DETAILED DESCRIPTION

Figure 1A:
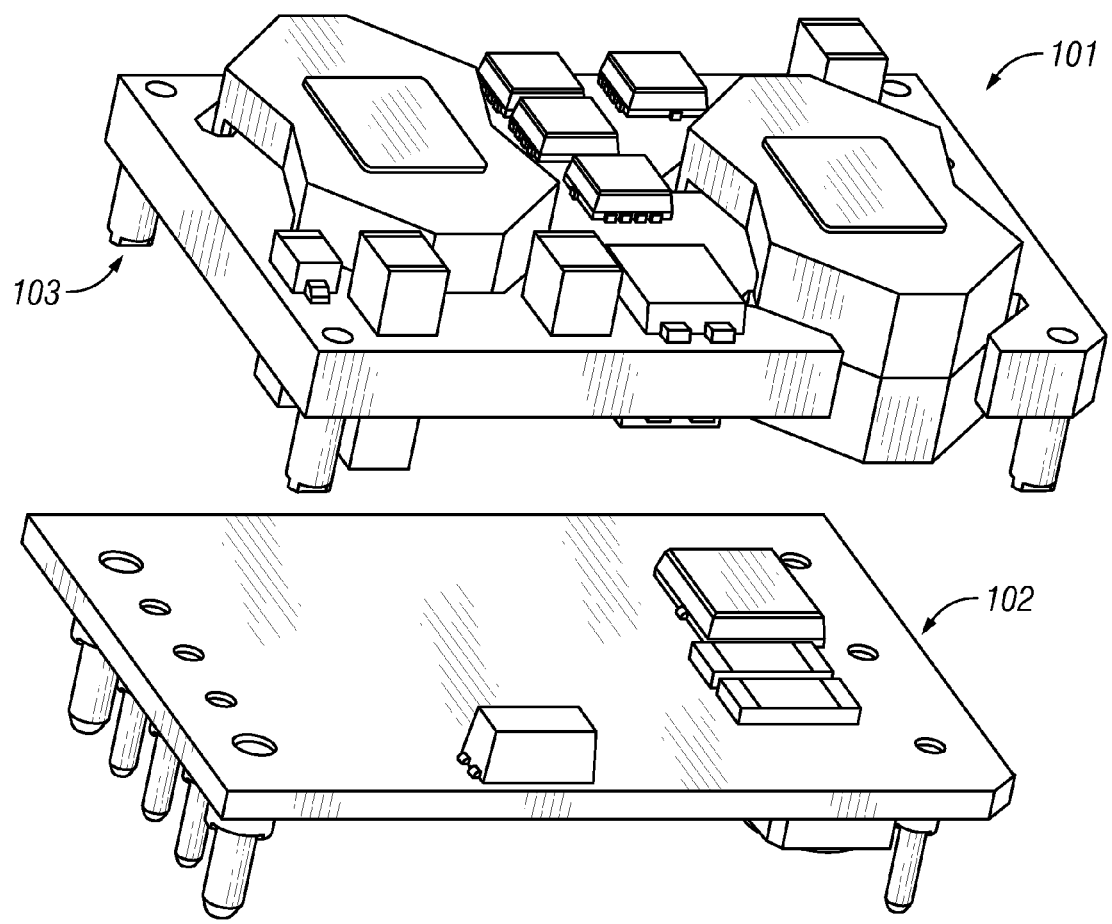
FIG. 1A shows a top perspective exploded view of a DC-DC power converter in accordance with a preferred embodiment of the present invention.
Figure 1B:
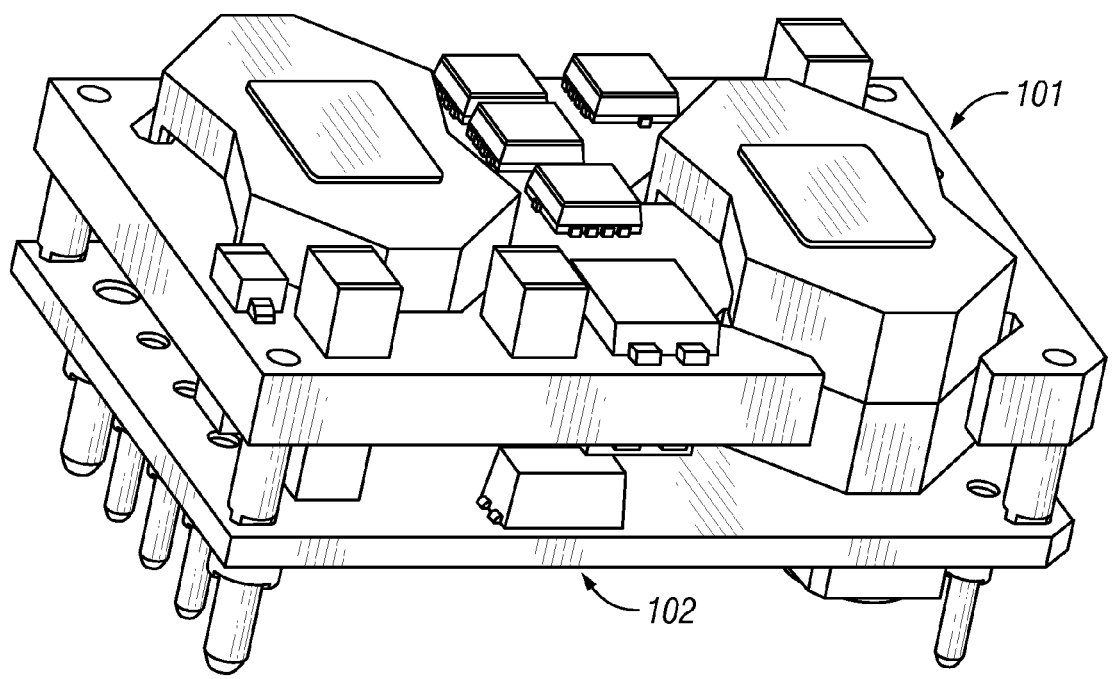
FIG. 1B is a top perspective view of the assembled power converter.

FIG. 1A shows a top perspective exploded view of a DC-DC power converter in accordance with a preferred embodiment of the present invention. FIG. 1B is a top perspective view of the assembled power converter. For ease of illustration, the example power converter shown in the figures comprises two multi-layer Printed Wiring Boards 101, 102 parallel to each other, connected by several interconnect pins. However, it should be emphasized that the present invention is not limited to two PWBs in parallel.

The open frame design allows airflow between the boards, increasing the surface area available for mounting components, and the parallel configuration allows fresh airflow to cool components regardless of the orientation of the power converter.

Figure 1C:
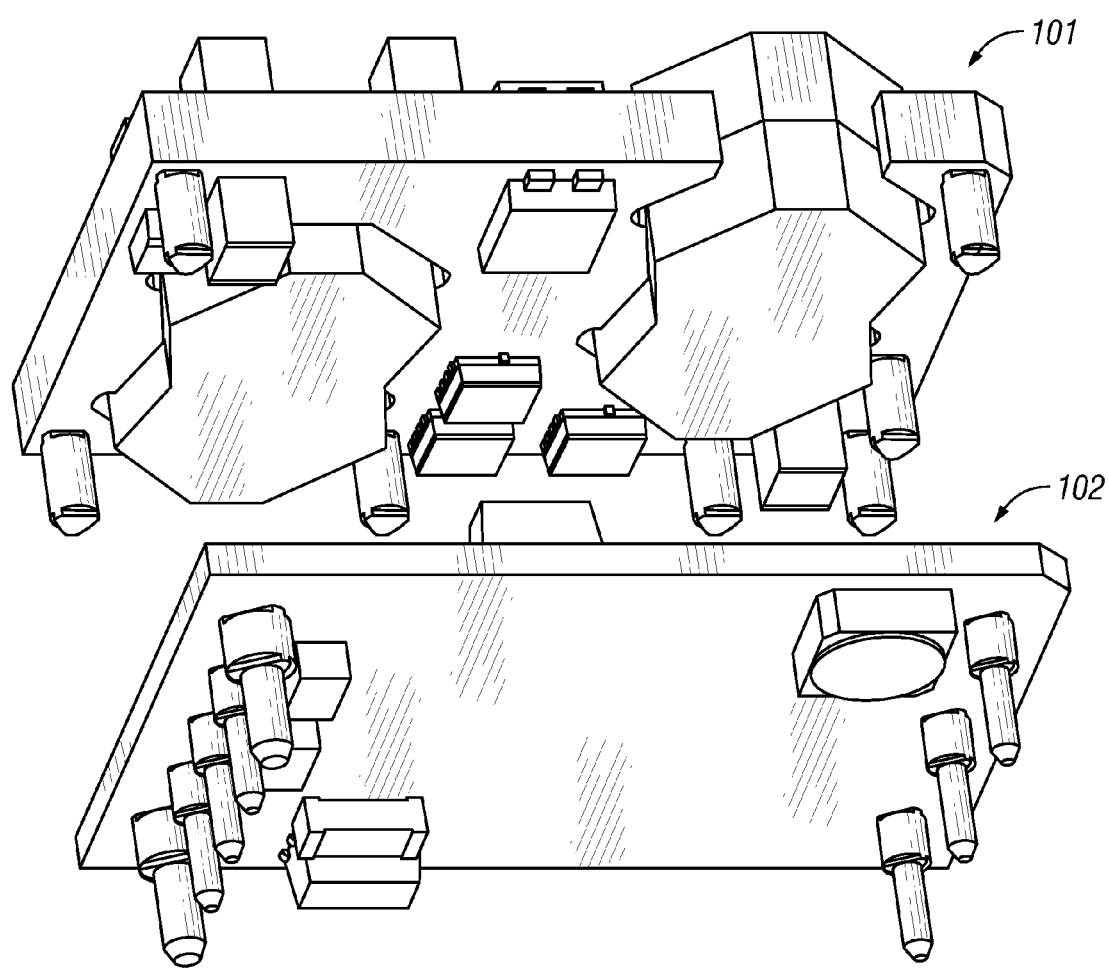
FIG. 1C is a bottom perspective exploded view of the power converter.
Figure 1D:
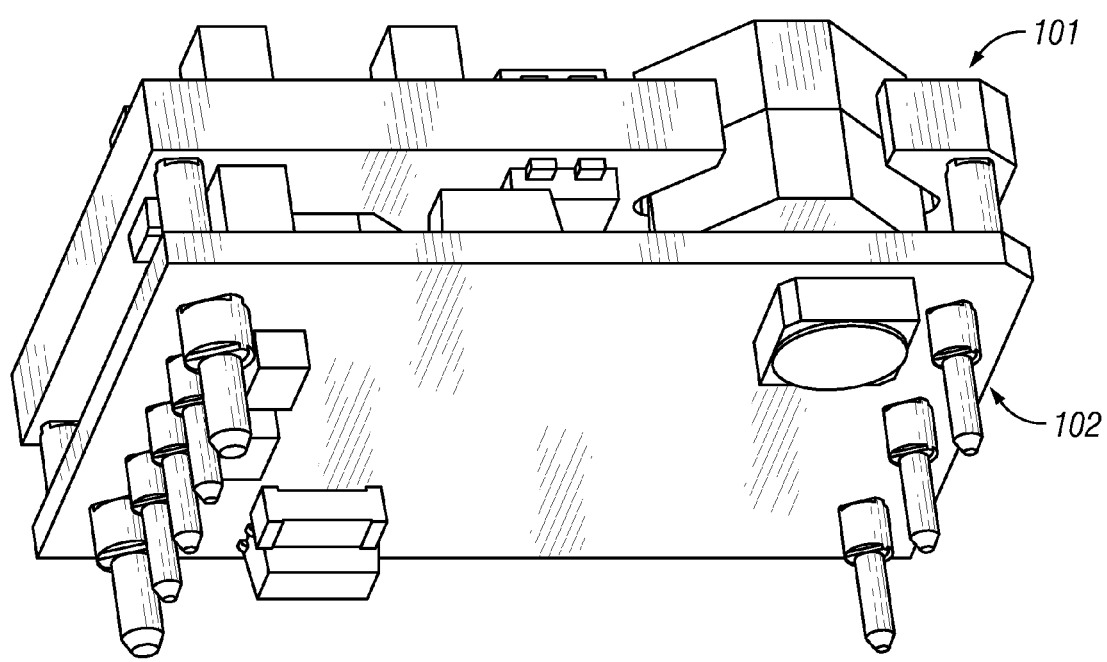
FIG. 1D is a bottom perspective view of the assembled power converter.

FIG. 1C is a bottom perspective exploded view of the power converter, and FIG. 1D is a bottom perspective view of the assembled power converter. As can be seen in FIGS. 1A-1D, unlike prior art power converter configurations, the present invention allows components to be mounted on both sides of both PWBs, thereby providing four mounting surfaces. In the preferred embodiment, the PWBs are made from Flame Resistant 4 (FR-4).

Figure 2:
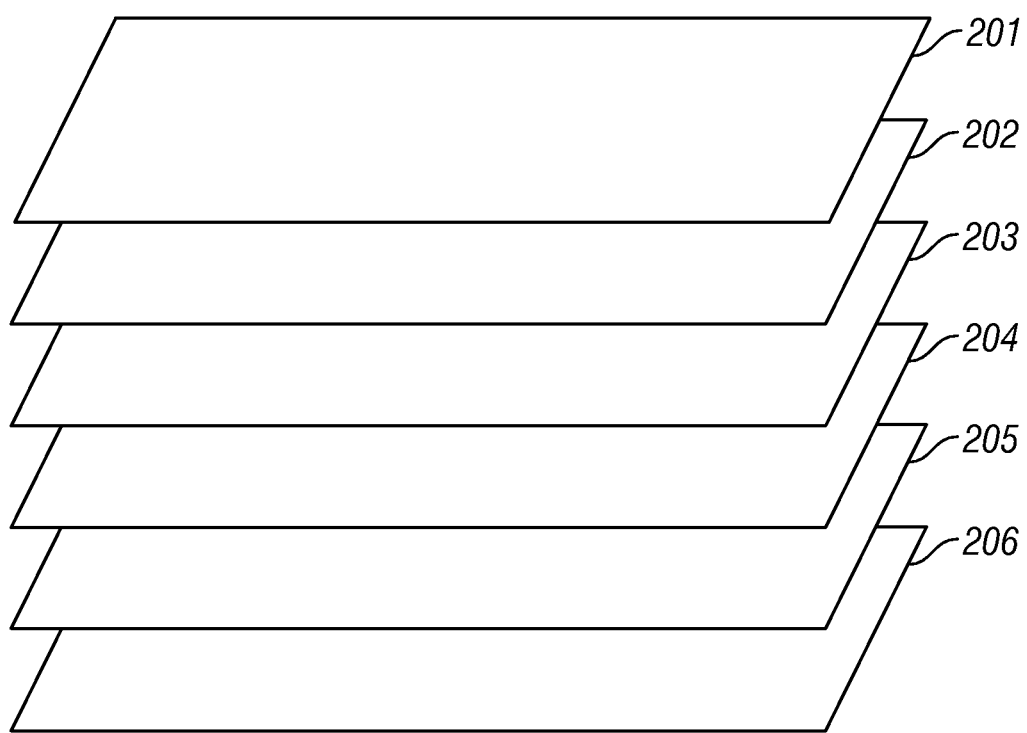
FIG. 2 shows a general perspective exploded view of the power converter consisting of multiple PWBs.

FIG. 2 shows a general perspective exploded view of the power converter consisting of multiple PWBs in accordance with a preferred embodiment of the present invention. This example illustrates how the present invention can be applied to power converters comprising more than two PWBs. The separate PWBs 201-206 allow thermal isolation of heat sensitive components (e.g., integrated circuits and optoelectronics) from power dissipating elements.

In the preferred embodiment of the present invention, additional PWBs are less costly due to a lower count of copper layers and because they house mainly control circuitry. The invention allows for cost reduction as well as the reuse of existing schematics and re-packaging of the power converter within a smaller footprint. In this manner, a schematic that is normally larger than an industry standard footprint can be repackaged within that footprint without having to reduce the size of the components and reduce the power level.

In addition, the present invention allows for increases in power level by placing more power elements (e.g., MOSFET) within the same fixed footprint by using two or more PWBs.

In one embodiment, the hottest components are placed on the upper board to protect more heat sensitive components mounted on the other surfaces. In this configuration, the power elements on the upper board are not blocked by neighboring electrical and electronic devices, and they also receive cooler and higher-speed airflow (see FIG. 3).

In general, to apply the planar magnetics technology (called "ferrite core on board") requires many layers of thick ("heavy" in the circuit board industry) copper clad to construct the powertrain, including the transformer windings. This generally makes an FR-4 PWB thick. In an attempt to fit within an industry-standard footprint, design engineers typically place other components on the remaining areas of the same PWB that houses the powertrain of a single-board power converter.

The present invention places the planar magnetics and powertrain components on one PWB, which can be a smaller industry-standard footprint. Other components are then mounted onto the other PWBs. Because the other PWBs do not contain all of the power elements, both the number and thickness of the copper clad layers in these additional PWBs can be reduced, thus allowing cost reduction.

It should be emphasized that the bottom PWB does not necessarily have to be thinner and devoid of any power elements. Board position in the z-axis can be swapped if needed, and a power Metal-Oxide Semiconductor Field-Effect Transistor (MOSFET), for example, can be placed on the lower board if there is a conduction mechanism to dissipate heat from the power elements to the mounted host board.

An important part of overall system design is thermal management and the dissipation of heat. Superior thermal design is a key element for a robust, reliable power module. A finite amount of heat has to be dissipated from the power module to the surrounding environment. This heat can be dissipated by the three modes of transfer: convection, conduction, and radiation. While all three modes of heat transfer are present to some extent in every application, convection is the dominant mode.

The open frame design of the present invention provides an air path to individual components mounted on the PWBs. This air path improves cooling to the surrounding environment, reducing areas of heat concentration and resulting hot spots.

Figure 3:
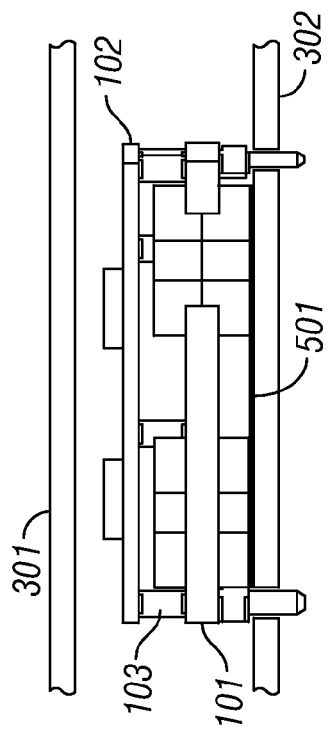
FIG. 3 is a side plan view of the power converter illustrating the channel airflow between two boards of a system level design in accordance with a preferred embodiment of the present invention.

FIG. 3 is a side plan view of the power converter illustrating the channel airflow between two boards of a system level design in accordance with a preferred embodiment of the present invention. As can be seen in the figure, the parallel orientation of PWBs 301, 302 forms a channel flow toward the PWBs 101 and 102. The airflow is greatest at the midpoint of the distance (pitch) between the PWBs 301, 302, as illustrated by arrows 310. Hot components on a PWB requiring the most heat dissipation may be placed closest to the center of the airflow channel formed by the boards 301, 302 if the major cooling method is convection heat transfer (i.e. heat dissipating to surrounding fluid media (air)).

The pins 103 that interconnect to the boards in the figures also act as current paths for both powertrain and signal transfer between the boards. Selection of topology and circuit partitioning can be used to minimize interconnects between the boards, thereby maximizing the available board area for mounting components.

Figure 4:
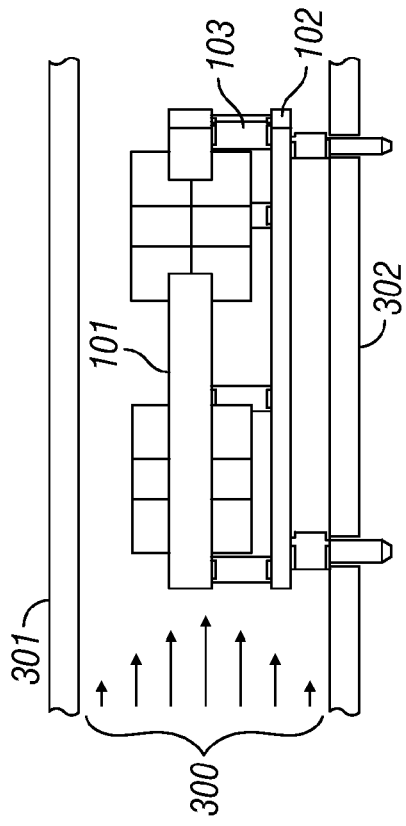
FIG. 4 is a side plan view of the power converter illustrating conduction heat transfer between two boards of a system level design in accordance with an alternate embodiment of the present invention.

FIG. 4 is a side plan view of the power converter illustrating conduction heat transfer between two boards of a system level design in accordance with an alternate embodiment of the present invention. If the major cooling method is conduction heat transfer (i.e., heat dissipation to a solid media in contact) instead of convection, the hot components may be placed on top of the upper PWB (i.e., the PWB side next to the solid media) or on the bottom of the lower PWB so as to contact the solid media of the conduction mechanism and create shorter heat path(s) and lower thermal resistance for heat dissipation.

In the embodiment illustrated in FIG. 4, the conduction heat path is through a thermal gap pad, metal baseplate with electrical insulation materials (such as thermal pad), clamshell with electrical insulation materials, etc. The heat path is created to carry heat from power elements on the upper board 101, through the additional solid media 401, to the top channel board 301, system envelope or other media at the top.

Figure 5:
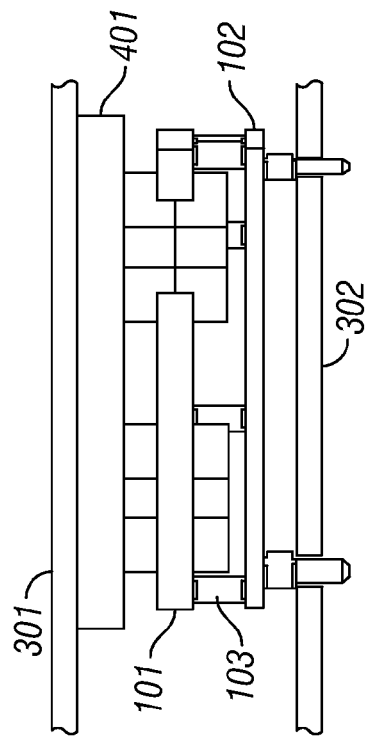
FIG. 5 is a side plan view of the power converter illustrating conduction heat transfer between two boards of a system level design in accordance with another alternate embodiment of the present invention.

FIG. 5 is a side plan view of the power converter illustrating conduction heat transfer between two boards of a system level design in accordance with another alternate embodiment of the present invention. Unlike the embodiment depicted in FIGS. 3 and 4, in this embodiment, the thick board 101 housing the power elements is placed below the thinner board 102. A sheet of thermal interface pad, grease, underfill or other solid media 501 is placed between the power elements on the thick lower board 101 and the bottom board 302. The heat path is created toward the bottom channel board 302, system envelope or other media at the bottom.

The present invention also has the advantage of providing a quick time to market with new products because it allows the repackaging of a larger single board design into a smaller dual or multiple board design, while maintaining the size of the power components and the final power rating.

While the power converter of the present invention may comprise more than two PWBs, many conventional systems incorporating the present invention have space restrictions that will limit the height of the power converter to two PWBs as a practical matter.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated. It will be understood by one of ordinary skill in the art that numerous variations will be possible to the disclosed embodiments without going outside the scope of the invention as disclosed in the claims.

We claim:

1. A DC-DC power converter, comprising:
   (a) two or more Printed Wiring Boards (PWB), wherein electronic components are mounted on both sides of each PWB; and
   (b) a plurality of connector pins that interconnect the PWBs together and act as current paths between the PWBs, wherein the connector pins hold the PWBs parallel to each other within the same footprint, wherein space between the PWBs allows airflow over components mounted on the PWBs.

2. The power converter according to claim 1, wherein one multilayer PWB comprises more copper clad layers than the other PWBs in the power converter.

3. The power converter according to claim 1, wherein the PWBs are comprised of Flame Resistant 4 (FR-4) epoxy resin bonded glass fabric.

4. The power converter according to claim 1, wherein power processing elements are housed on one PWB and control circuitry is mounted on the other PWBs in the power converter.

5. The power converter according to claim 4, wherein said other PWBs housing the control circuitry have fewer copper layers and thinner copper clad thickness than the PWB housing the power elements.

6. The power converter according to claim 4, further comprising a thermally conductive medium adjacent to the power elements.

7. The power converter according to claim 1, wherein additional PWBs can be used to house additional power elements within the same footprint, thereby increasing the power level of the power converter.

* * * * *